(12) United States Patent
Suzuki et al.

(10) Patent No.: US 8,174,675 B2
(45) Date of Patent: May 8, 2012

(54) MEASURING APPARATUS, OPTICAL SYSTEM MANUFACTURING METHOD, EXPOSURE APPARATUS, DEVICE MANUFACTURING METHOD, AND PROCESSING APPARATUS

(75) Inventors: Takeshi Suzuki, Utsunomiya-shi (JP); Yoshiyuki Kuramoto, Utsunomiya-shi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/840,951

(22) Filed: Jul. 21, 2010

(65) Prior Publication Data

US 2011/0027723 A1    Feb. 3, 2011

(30) Foreign Application Priority Data

Jul. 29, 2009  (JP) ................. 2009-177028

(51) Int. Cl.
 *G03B 27/52* (2006.01)
 *G03B 27/42* (2006.01)
(52) U.S. Cl. .......................... 355/55; 355/53
(58) Field of Classification Search ............ 355/52, 355/53, 55, 67; 356/399–401, 515
See application file for complete search history.

(56) References Cited

U.S. PATENT DOCUMENTS

| | | | |
|---|---|---|---|
| 6,633,362 B2 | 10/2003 | Murakami et al. | |
| 6,924,881 B2 | 8/2005 | Murakami et al. | |
| 6,937,345 B2 | 8/2005 | Kuramoto | |
| 7,016,025 B1 * | 3/2006 | Hansen | 356/124 |
| 7,375,799 B2 * | 5/2008 | Van De Kerkhof et al. | 355/71 |
| 7,773,233 B2 * | 8/2010 | Kakuchi et al. | 356/515 |
| 2008/0273200 A1 | 11/2008 | Kakuchi et al. | |

FOREIGN PATENT DOCUMENTS

| | | |
|---|---|---|
| JP | 2000-277411 A | 10/2000 |
| JP | 2002-022608 A | 1/2002 |
| JP | 2008-277632 A | 11/2008 |

* cited by examiner

*Primary Examiner* — Hung Henry Nguyen
(74) *Attorney, Agent, or Firm* — Canon U.S.A., Inc. IP Division

(57) ABSTRACT

The present invention provides a processing apparatus which executes sampling of data and represents the sampled data by linear combination of orthogonal functions, the apparatus including a device configured to execute the sampling, and a processor configured to process the data sampled by the device, wherein the processor is configured, if the data sampled by the device includes an invalid sampling point, to obtain a degree of break of orthogonality of an orthogonal function system caused by the invalid sampling point, and to evaluate reliability of the sampling based on the obtained degree.

10 Claims, 7 Drawing Sheets

MEASURING APPARATUS, OPTICAL SYSTEM MANUFACTURING METHOD, EXPOSURE APPARATUS, DEVICE MANUFACTURING METHOD, AND PROCESSING APPARATUS

BACKGROUND OF THE INVENTION

1. Field of the Invention

The present invention relates to a measuring apparatus, optical system manufacturing method, exposure apparatus, device manufacturing method, and processing apparatus.

2. Description of the Related Art

In image processing or signal processing, sampled data (sampling data) is sometimes represented using orthogonal functions (orthogonal polynomials). For example, in the field of optics, the wavefront aberration of the projection optical system of an exposure apparatus is represented using Zernike polynomials as orthogonal functions of pupil coordinates.

There are roughly two reasons why fitting of Zernike polynomials is used in the field of optics. The first is that the Zernike polynomials are orthogonal in a circular region. The second is that the terms of Zernike polynomials correspond to the aberrations of an optical system, and easy handling based on the aberration theory is possible. The terms (y-θ coordinates) of the Zernike polynomials are represented by $Z1=1$ $Z2=r\cos(\theta)$ $Z3=r\sin(\theta)$ $Z4=2r^2-1$ $Z5=r^2\cos(2\theta)$ $Z6=r^2\sin(2\theta)$ $Z7=(3r^3-2r)\cos(\theta)$ $Z8=(3r^3-2r)\sin(\theta)$ $Z9=(6r^4-6r^2+1)$ $Z10=r^3\cos(3\theta)$ $Z11=r^3\sin(3\theta)$ $Z12=(4r^4-3r^2)\cos(2\theta)$ $Z13=(4r^4-3r^2)\sin(2\theta)$ $Z14=(10r^5-12r^3+3r)\cos(\theta)$ $Z15=(10r^5-12r^3+3r)\sin(\theta)$ $Z16=(20r^6-30r^4+12r^2-1)$ $Z17=r^4\cos(4\theta)$ $Z18=r^4\sin(4\theta)$ $Z19=(5r^5-4r^3)\cos(3\theta)$ $Z20=(5r^5-4r^3)\sin(3\theta)$ $Z21=(15r^6-20r^4+6r^2)\cos(2\theta)$ $Z22=(15r^6-20r^4+6r^2)\sin(2\theta)$ $Z23=(35r^7-60r^5+30r^3-4r)\cos(\theta)$ $Z24=(35r^7-60r^5+30r^3-4r)\sin(\theta)$ $Z25=(70r^8-140r^6+90r^4-20r^2+1)$ $Z26=r^5\cos(5\theta)$ $Z27=r^5\sin(5\theta)$ $Z28=(6r^6-5r^4)\cos(4\theta)$ $Z29=(6r^6-5r^4)\sin(4\theta)$ $Z30=(21r^7-30r^5+10r^3)\cos(3\theta)$ $Z31=(21r^7-30r^5+10r^3)\sin(3\theta)$ $Z32=(56r^8-105r^6+60r^4-10r^2)\cos(2\theta)$ $Z33=(56r^8-105r^6+60r^4-10r^2)\sin(2\theta)$ $Z34=(126r^9-280r^7+210r^5-60r^3+5r)\cos(\theta)$ $Z35=(126r^9-280r^7+210r^5-60r^3+5r)\sin(\theta)$ $Z36=(252r^{10}-630r^8+560r^6-210r^4+30r^2-1)$ The wavefront aberration of the projection optical system is generally measured using an interferometer, as disclosed in Japanese Patent Laid-Open Nos. 2000-277411, 2002-022608, and 2008-277632. For example, when a Fizeau interferometer is used, an image sensor having an imaging plane formed from a plurality of pixels senses interference fringes between detection target light transmitted through the projection optical system and reference light reflected by the Fizeau surface. The phase is calculated from the strength of the interference fringes sensed by the image sensor, and Zernike polynomials are fitted to obtain the wavefront aberration of the projection optical system.

In the conventional technique, accurate phase calculation may be impossible because of, for example, degradation in the visibility of interference fringes caused by disturbance or defects of the interferometer itself (for example, manufacturing errors in the optical system or stage errors). In this case, pixels that have failed in accurate phase calculation are made invalid (missing points). Abnormality in the image data (sampling data) of each pixel is detected based on the number of valid pixels (that is pixels that have succeeded in accurate phase calculation).

However, in abnormality detection based on the number of valid pixels, for example, the reliability (orthogonality) of sampling data for the Zernike polynomials serving as evaluation functions cannot be evaluated. More specifically, even if the number of missing points does not change, the generated error amount changes because a missing point in the periphery of the pupil and a missing point at the center of the pupil have different contributions to the Zernike polynomials. That is, abnormality detection by the number of valid pixels lacks strictness. In addition, when fitting orthogonal functions to sampling data containing missing points, it is necessary to evaluate the reliability of the sampling data for the orthogonal functions, not only concerning the wavefront aberration of the projection optical system.

SUMMARY OF THE INVENTION

The present invention provides, for example, a technique advantageous in evaluating reliability of data that will undergo an orthogonal transform.

According to one aspect of the present invention, there is provided a processing apparatus which executes sampling of data and represents the sampled data by linear combination of orthogonal functions, the apparatus including a device configured to execute the sampling, and a processor configured to process the data sampled by the device, wherein the processor is configured, if the data sampled by the device includes an invalid sampling point, to obtain a degree of break of orthogonality of an orthogonal function system caused by the invalid sampling point, and to evaluate reliability of the sampling based on the obtained degree.

Further aspects of the present invention will become apparent from the following description of exemplary embodiments with reference to the attached drawings.

DESCRIPTION OF THE EMBODIMENTS

Figure 1:
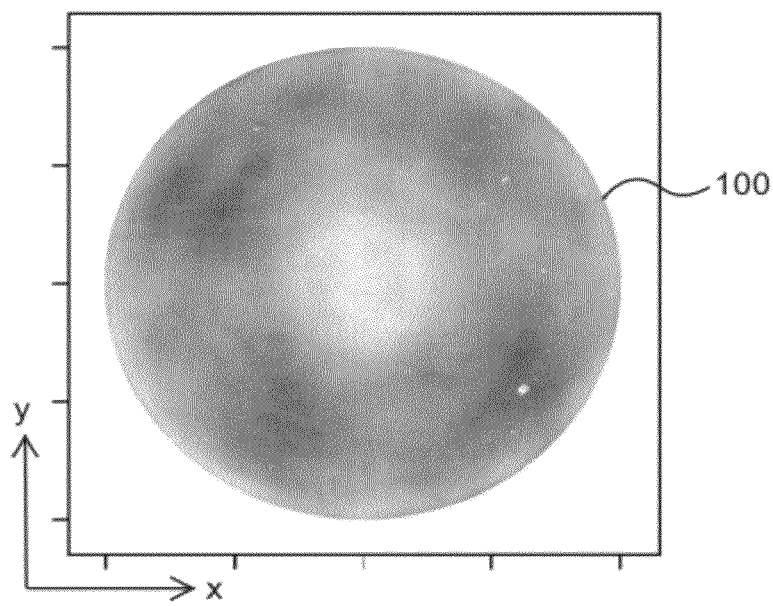
FIG. 1 is a view showing the wavefront aberration map of a projection optical system as an example of sampling data.

Preferred embodiments of the present invention will be described below with reference to the accompanying drawings. Note that the same reference numerals denote the same members throughout the drawings, and a repetitive description thereof will not be given.

Figure 2:
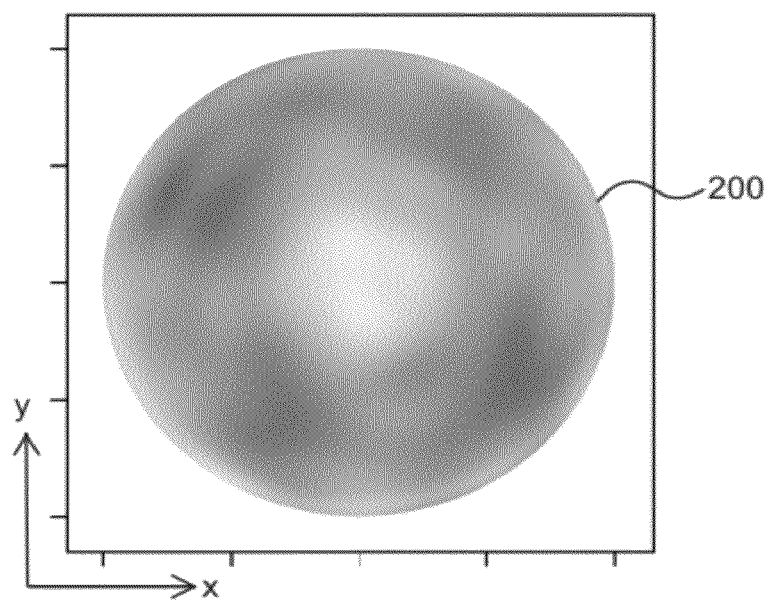
FIG. 2 is a view showing a result obtained by fitting Zernike polynomials to the wavefront aberration map shown in FIG. 1.

In the following embodiments, a description will be made using the wavefront aberration of a projection optical system as sampling data (discrete sampling result), and Zernike polynomials as orthogonal functions to be fitted to the sampling data. FIG. 1 shows an example of the wavefront aberration map 100 of a projection optical system. Referring to FIG. 1, the X-Y plane corresponds to each point on the pupil of a projection optical system. FIG. 2 is a view showing a resulting map 200 obtained by fitting Zernike polynomials to the wavefront aberration map shown in FIG. 1. As is apparent from FIG. 2, the wavefront aberration (phase information) shown in FIG. 1 is accurately reproduced.

Figure 3:
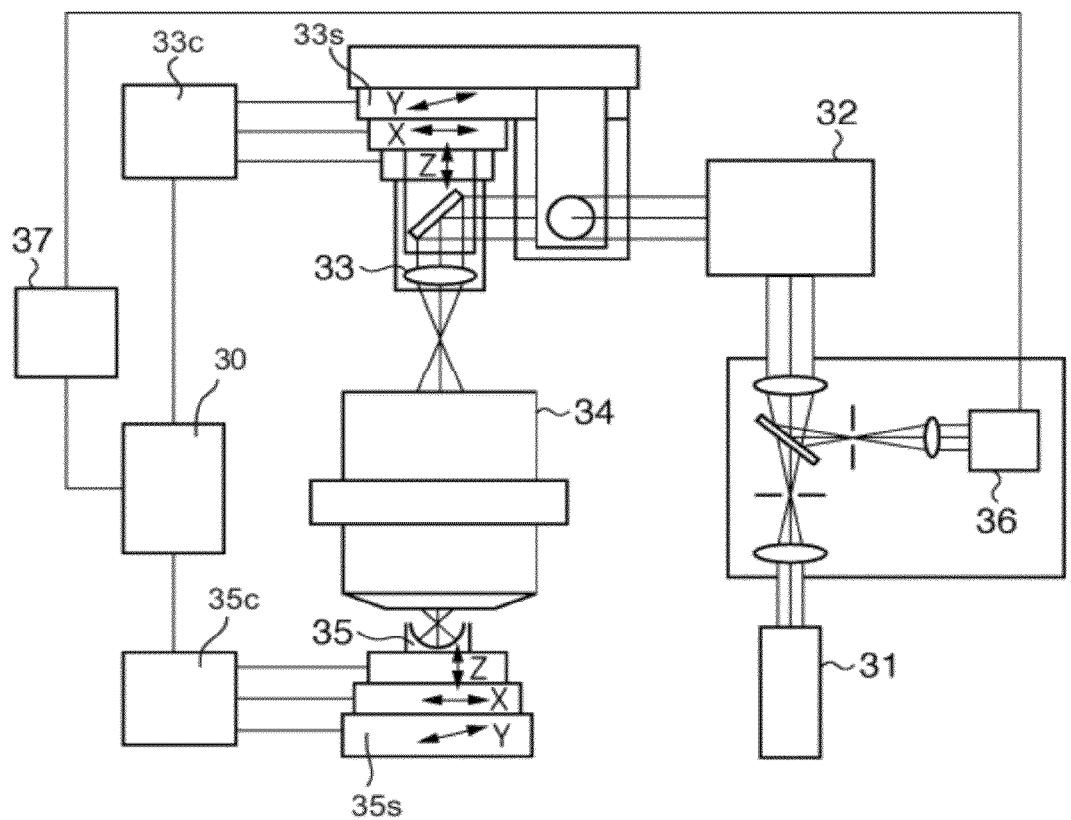
FIG. 3 is a schematic view showing an example of the arrangement of a Fizeau interferometer.

Note that the wavefront aberration of the projection optical system can be measured using, for example, a Fizeau interferometer as shown in FIG. 3. A laser beam emitted by a light source 31 enters a TS (tilt-shift) lens 33 via a routing optical system 32. The laser beam that has entered the TS lens 33 is split into reference light (light reflected by the Fizeau surface) and detection target light (light transmitted through the Fizeau surface) by the Fizeau surface (reference surface or reference plane) of the TS lens 33. The detection target light transmitted through the Fizeau surface passes through a projection optical system 34 that is an optical system to be measured, and is then reflected by a reflecting mirror 35. The detection target light returns to the routing optical system 32 through almost the same optical path, and reaches an image sensor 36. The reference light reflected by the Fizeau surface returns to the routing optical system 32 through almost the same optical path, and reaches the image sensor 36. The image sensor 36 detects interference fringes (interference pattern) formed by the detection target light and the reference light. A control unit 37 performs phase calculation and Zernike polynomial fitting based on the (strength data of the) interference fringes detected by the image sensor 36, thereby calculating the wavefront aberration of the projection optical system. To perform the phase calculation and Zernike polynomial fitting, the control unit 37 obtains the strength data of the interference fringes detected by the image sensor 36, while controlling positioning of the TS lens 33 and reflecting mirror 35 via a controller 30 that in turn controls a first stage controller 35c and a second stage controller 33c, as described below in reference to FIG. 6.

First Embodiment

In the first embodiment, evaluation of the reliability (orthogonality) of sampling data when fitting Zernike polynomials to the wavefront aberration of a projection optical system as sampling data will mainly be described.

As a characteristic feature of Zernike polynomials, they are orthogonal in a circular region ($0 \leq r \leq 1$, $1 \leq \theta \leq 2\pi$). In the Zernike polynomials, the orthogonal relation between and ith term and the jth term is given by $$\int_0^1 \int_0^{2\pi} Z_i(r, \theta) Z_j(r, \theta) r \, dr \, d\theta \tag{1}$$

where Zi is the ith term of the Zernike polynomials, and Zj is the jth term of the Zernike polynomials.

Letting n be the number of sampling data in the integration region, $x_k$ be the kth point, and $w_k$ be the measured value at the point $x_k$, expression (1) can be represented by $$\sum_{k=1}^{n} Z_i(x_k) Z_j(x_k) = Z_i(x_1) Z_j(x_1) + \ldots + Z_i(x_{k-1}) Z_j(x_{k-1}) + \tag{2}$$
$$Z_i(x_k) Z_j(x_k) + Z_i(x_{k+1}) Z_j(x_{k+1}) + \ldots + Z_i(x_n) Z_j(x_n)$$

Figure 4:
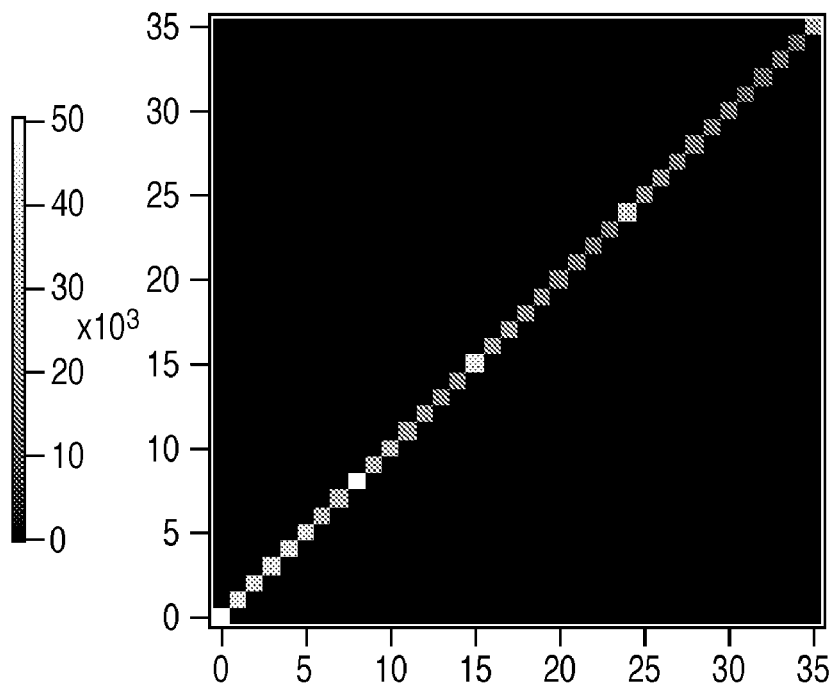
FIG. 4 is a view showing a matrix representing the calculation result of equation (2) (when sampling data contain no missing points).

FIG. 4 is a view showing a matrix representing the calculation result of equation (2). Referring to FIG. 4, the abscissa corresponds to i of equation (2), and the ordinate corresponds to j of equation (2). Each point of the matrix represents the calculation result of equation (2) for the ith term of the Zernike polynomials and the jth term of the Zernike polynomials. FIG. 4 shows the calculation result when the sampling data contain no missing points (that is, when all the sampling data are valid). Referring to FIG. 4, diagonal components mainly have values, whereas non-diagonal components are almost 0 because of the orthogonality of the Zernike polynomials. In FIG. 4, absolute values are used for representation easy to understand, and the maximum value of the scale does not match the maximum value of the calculation result.

On the other hand, if, for example, the kth point $x_k$ is missing, the (sum of the) point $x_k$ is excluded from the integration of expression (1), as represented by $$\sum_{k=1}^{n} Z_i(x_k)Z_j(x_k) = Z_i(x_1)Z_j(x_1) + \ldots + \\ Z_i(x_{k-1})Z_j(x_{k-1}) + Z_i(x_{k+1})Z_j(x_{k+1}) + \ldots + Z_i(x_n)Z_j(x_n) \quad (3)$$

Figure 5:
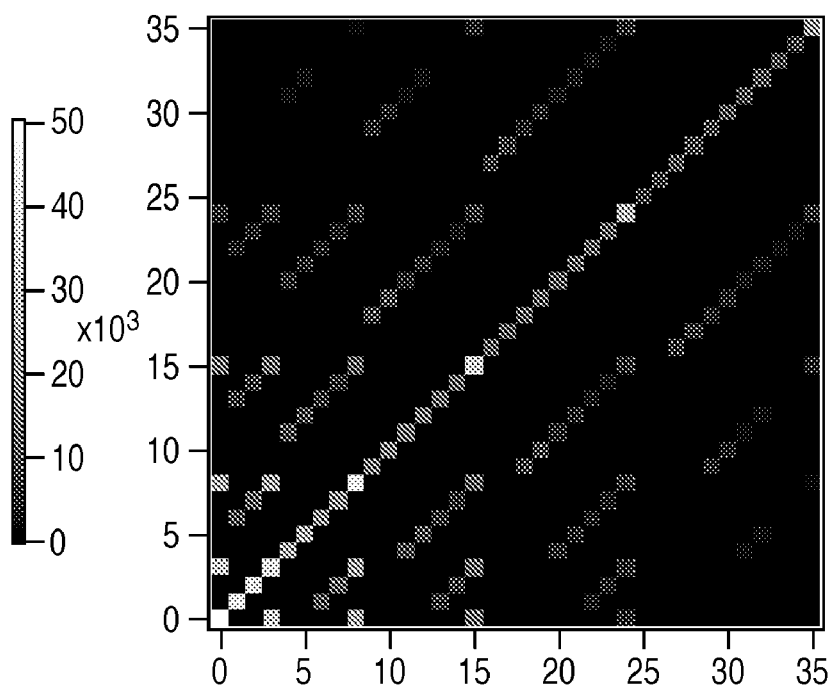
FIG. 5 is a view showing a matrix representing the calculation result of equation (3) (when sampling data contain missing points).

FIG. 5 is a view showing a matrix representing the calculation result of equation (3). Referring to FIG. 5, the abscissa corresponds to i of equation (3), and the ordinate corresponds to j of equation (3). Each point of the matrix represents the calculation result of equation (3) for the ith term of the Zernike polynomials and the jth term of the Zernike polynomials. As is apparent from FIG. 5, if the sampling data contain missing points, the non-diagonal components have larger values than in FIG. 4, and the orthogonality is lost. In FIG. 5, absolute values are used for representation easy to understand, and the maximum value of the scale does not match the maximum value of the calculation result.

The reliability of the sampling data can be evaluated using expression (1) and the missing position information of the measurement result of the wavefront aberration. More specifically, first, for the point $x_k$ where the measured value $w_k$ is valid out of the n sampling data, a sum Err of $g_i(x_k)g_j(x_k)$ is calculated by $$Err = \sum_{i=1}^{m}\sum_{j=1}^{m}\int |g_i(x_k)g_j(x_k)dk| \text{ (for } i \neq j\text{)} \quad (4)$$

The reliability of the sampling data is evaluated based on whether the sum Err exceeds a threshold C. In this embodiment, the sum Err is compared with the threshold C. If the sum Err with respect to the threshold C satisfies $$C \geq Err \quad (5)$$

the sampling data is evaluated to be reliable (that is, the reliability of the sampling data is guaranteed). Note that the threshold C is determined based on the missing points of sampling data, the value of the sum Err, and the error amount of the fitting result on the simulation basis.

That is, according to this embodiment, not the number of missing points of sampling data but the orthogonality of sampling data for orthogonal functions to be fitted is evaluated, thereby more strictly evaluating the reliability of sampling data.

Figure 6:
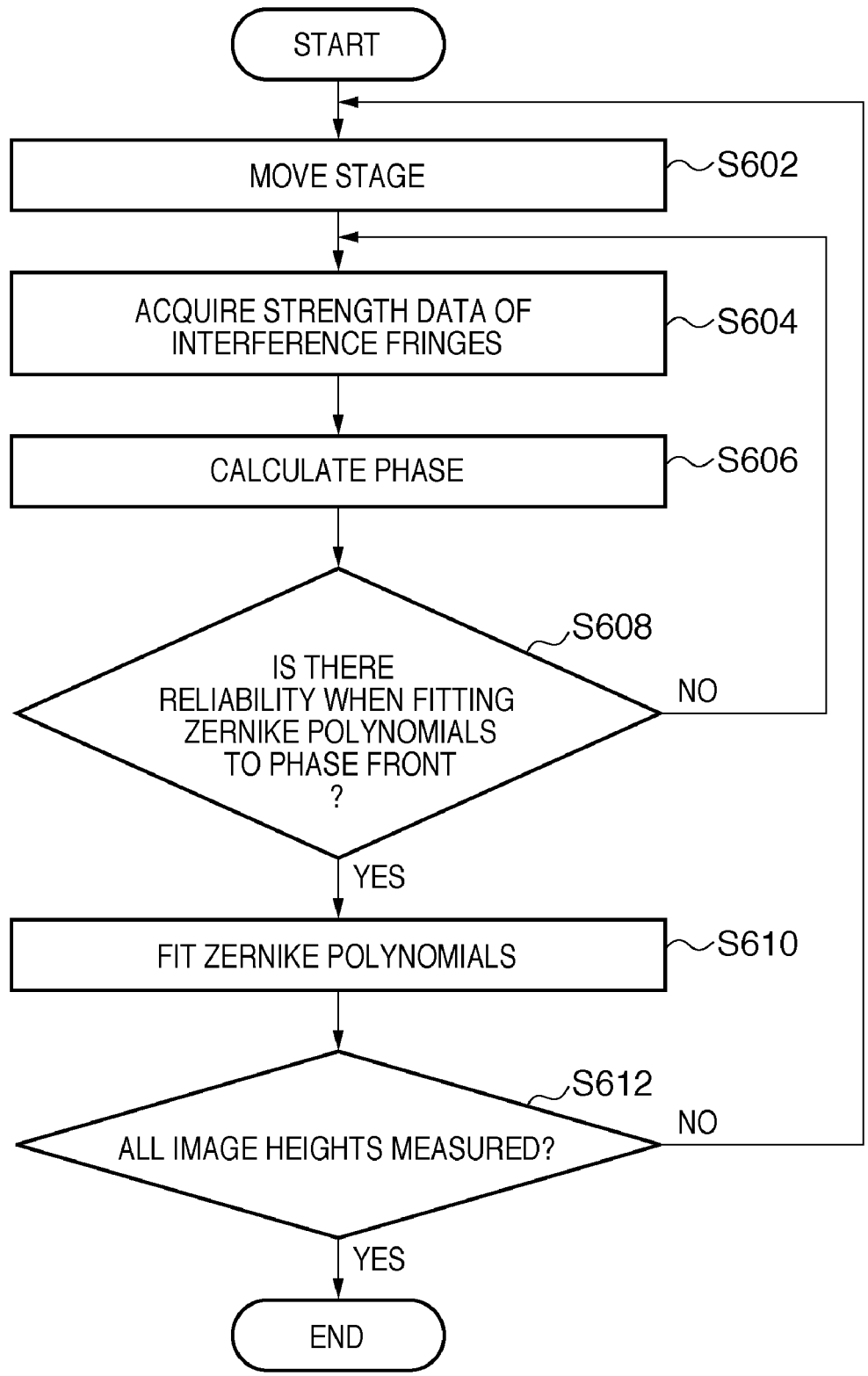
FIG. 6 is a flowchart for explaining a method of measuring the wavefront aberration of the projection optical system.

A method of measuring the wavefront aberration of the projection optical system, including sampling data evaluation of the first embodiment, will be described with reference to FIG. 6. In this embodiment, an example will be explained in which the wavefront aberration of the projection optical system is measured using the interferometer shown in FIG. 3. Note that the processing of measuring the wavefront aberration of the projection optical system is implemented by causing the control unit 37 of the interferometer shown in FIG. 3 to comprehensively control the units of the interferometer.

In step S602, the stage 35s that holds the reflecting mirror 35 or the stage 33s that holds the TS lens 33 is moved, respectively, by the first stage controller 35c or the second stage controller 33c, so that detection target light that has passed the image height of the measurement target of the projection optical system 34 strikes the reflecting mirror 35. In step S604, the image sensor 36 detects interference fringes between the detection target light that has passed the image height of the measurement target and reference light reflected by the Fizeau surface of the TS lens 33, thereby acquiring the strength data of the interference fringes. In step S606, the phase of the light that has passed the image height of the measurement target is calculated based on the strength data of the interference fringes acquired in step S604. In step S608, in accordance with sampling data evaluation of the first embodiment, the reliability of the phase front when fitting Zernike polynomials to the phase front calculated by the phase calculation in step S606 is evaluated by control unit 37. If the reliability of the phase front is guaranteed (that is, the phase front is reliable), in step S610, the Zernike polynomials are fitted to the phase front calculated by the phase calculation in step S606. On the other hand, if the reliability of the phase front is not guaranteed (that is, the phase front is not reliable), the process returns to step S604 to acquire the strength data of the interference fringes again. In step S612, it is determined whether all the image heights of the measurement target of the projection optical system 34 have been measured. If not all the image heights have been measured, the process returns to step S602 to measure the next image height. If all the image heights have been measured, the measurement of the wavefront aberration of the projection optical system ends.

Second Embodiment

In the second embodiment, evaluation of the reliability (orthogonality) of sampling data when fitting Zernike polynomials to the wavefront aberration of a projection optical system as sampling data will mainly be described, as in the first embodiment. In the second embodiment, the reliability of sampling data is evaluated from the change of coefficients when the number of terms of Zernike polynomials to be fitted is changed. Hence, the reliability of sampling data can be evaluated on the basis of coefficients of Zernike polynomials.

First, a method of fitting Zernike polynomials represented by linear combination of orthogonal functions with m terms to n sampling data $(x_k, w_k)$ where $x_k$ is the kth point, and $w_k$ is the measured value at the point $x_k$ will be described. A function to be fitted to the ith sampling data is defined by $$F(x) = \sum_{i=1}^{m} a_i g_i(x) \quad (6)$$

The sum of squares (variance) $\Phi$ of the fitting residual is given by $$\Phi = \sum_{k=1}^{n} (w_k - F(x_k))^2 \quad (7)$$

To minimize the sum of squares $\Phi$ of fitting residual, a coefficient $a_i$ with which the partial differential coefficient for the coefficient of each term of the sum of squares $\Phi$ is 0 is calculated by $$\frac{\partial \Phi}{\partial a_j} = 2\sum_{i=1}^{n}(w_i - F(x_i))g_j(x_i) = 0 \quad (8)$$

Equation (8) is represented by $$\begin{pmatrix} \sum_k^n g_1(x_k)g_1(x_k) & \sum_k^n g_1(x_k)g_2(x_k) & \cdots & \sum_k^n g_1(x_k)g_m(x_k) \\ \sum_k^n g_2(x_k)g_1(x_k) & \sum_k^n g_2(x_k)g_2(x_k) & \cdots & \sum_k^n g_2(x_k)g_m(x_k) \\ \vdots & \vdots & \ddots & \vdots \\ \sum_k^n g_m(x_k)g_1(x_k) & \sum_k^n g_m(x_k)g_2(x_k) & \cdots & \sum_k^n g_m(x_k)g_m(x_k) \end{pmatrix} \begin{pmatrix} a_1 \\ a_2 \\ \vdots \\ a_m \end{pmatrix} = \begin{pmatrix} \sum_k^n g_1(x_k)w_k \\ \sum_k^n g_2(x_k)w_k \\ \vdots \\ \sum_k^n g_m(x_k)w_k \end{pmatrix} \quad (9)$$

When G, A, and W are defined by $$G = \begin{pmatrix} g_1(x_1) & g_2(x_1) & \cdots & g_m(x_1) \\ g_1(x_2) & g_2(x_2) & \cdots & g_m(x_2) \\ \vdots & \vdots & \ddots & \vdots \\ g_1(x_n) & g_2(x_n) & \cdots & g_m(x_n) \end{pmatrix}, A = \begin{pmatrix} a_1 \\ a_2 \\ \vdots \\ a_m \end{pmatrix}, W = \begin{pmatrix} w_1 \\ w_2 \\ \vdots \\ w_n \end{pmatrix} \quad (10)$$

equation (9) is rewritten as $$G^T G A = G^T W \text{ (for } G^T \text{ is the transpose of } G) \quad (11)$$

The least square solution is obtained by solving equation (9) or (11) by, for example, Gaussian elimination or LU decomposition.

Evaluation of the reliability of the sampling data will be described next. If the sampling data contains no missing points (that is, the sampling data is reliable), the same fitting result should be obtained independently of the number of terms of orthogonal functions to be fitted. However, if the sampling data contains missing points (that is, the sampling data is not reliable), the fitting result changes upon changing the number of terms of orthogonal functions to be fitted. It is therefore possible to evaluate the reliability of sampling data from the change of coefficients when the number of terms of Zernike polynomials to be fitted to the wavefront aberration of the projection optical system is changed.

For example, let $a^r$ be the coefficient of each term when Zernike polynomials using first predetermined terms from the first term to the rth term are fitted to the n sampling data $(x_k, w_k)$. Let $a^s$ be the coefficient of each term when Zernike polynomials using second predetermined terms from the first term to the sth term are fitted to the n sampling data $(x_k, w_k)$. Note that the second predetermined terms include the first predetermined terms and are larger in number than the first predetermined terms (that is, r<s). For the ith term of Zernike polynomials, a change $Err_i$ upon changing the number of terms of the Zernike polynomials to be used for fitting is given by $$Err_i = |a_i^r - a_i^s| \quad (12)$$

Let $Err_{max}$ be the maximum change of the changes $Err_i$ (1<i<r). The reliability of the sampling data is evaluated based on whether the change $Err_{max}$ exceeds a threshold C. In this embodiment, the change $Err_{max}$ is compared with the threshold C. If the change $Err_{max}$ with respect to the threshold C satisfies $$C \geq Err_{max} \quad (13)$$

the sampling data is evaluated to be reliable (that is, the reliability of the sampling data is guaranteed). Note that the threshold C is determined based on comparison between the missing points of sampling data and the change $Err_{max}$ on the simulation basis.

Figure 7:
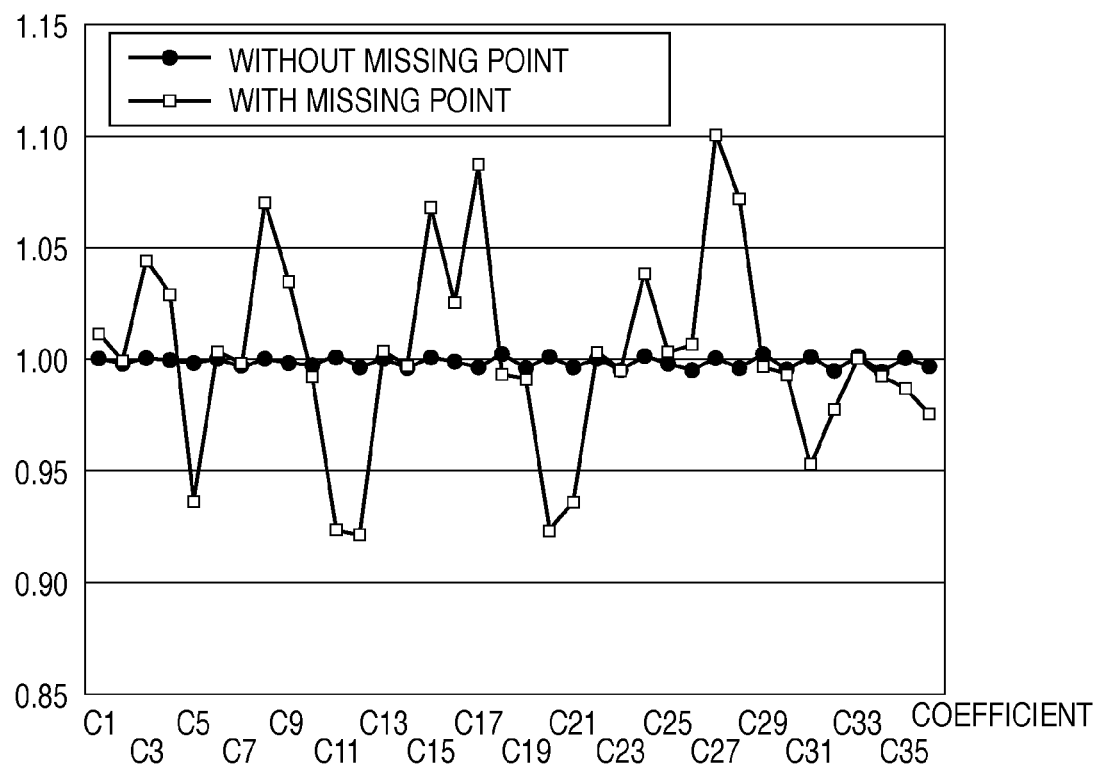
FIG. 7 is a graph showing the differences between the coefficients of terms when Zernike polynomials using the first to 36th terms are fitted to a sample wavefront and those when Zernike polynomials using the first to 169th terms are fitted to the sample wavefront.

FIG. 7 is a graph showing the differences between the coefficients of terms when Zernike polynomials using the first to 36th terms are fitted to a sample wavefront and those when Zernike polynomials using the first to 169th terms are fitted to the sample wavefront. Note that the sample wavefront has such a shape in which all the first to 169th terms of the Zernike polynomials are 1. In FIG. 7, a first term C1 to a 36th term C36 of the Zernike polynomials are plotted along the abscissa, and the differences between the coefficients of the terms are plotted along the ordinate. Referring to FIG. 7, if the sampling front has no missing points, the differences between the coefficients of the terms are small even when the number of terms of the Zernike polynomials to be fitted is changed. However, if the sampling front has missing points, the coefficients of the terms generate differences of about 10% upon changing the number of terms of the Zernike polynomials to be fitted.

That is, according to this embodiment, not the number of missing points of sampling data but the change of coefficients when the number of terms of orthogonal functions to be fitted is changed is evaluated, thereby more strictly evaluating the reliability of sampling data.

Figure 8:
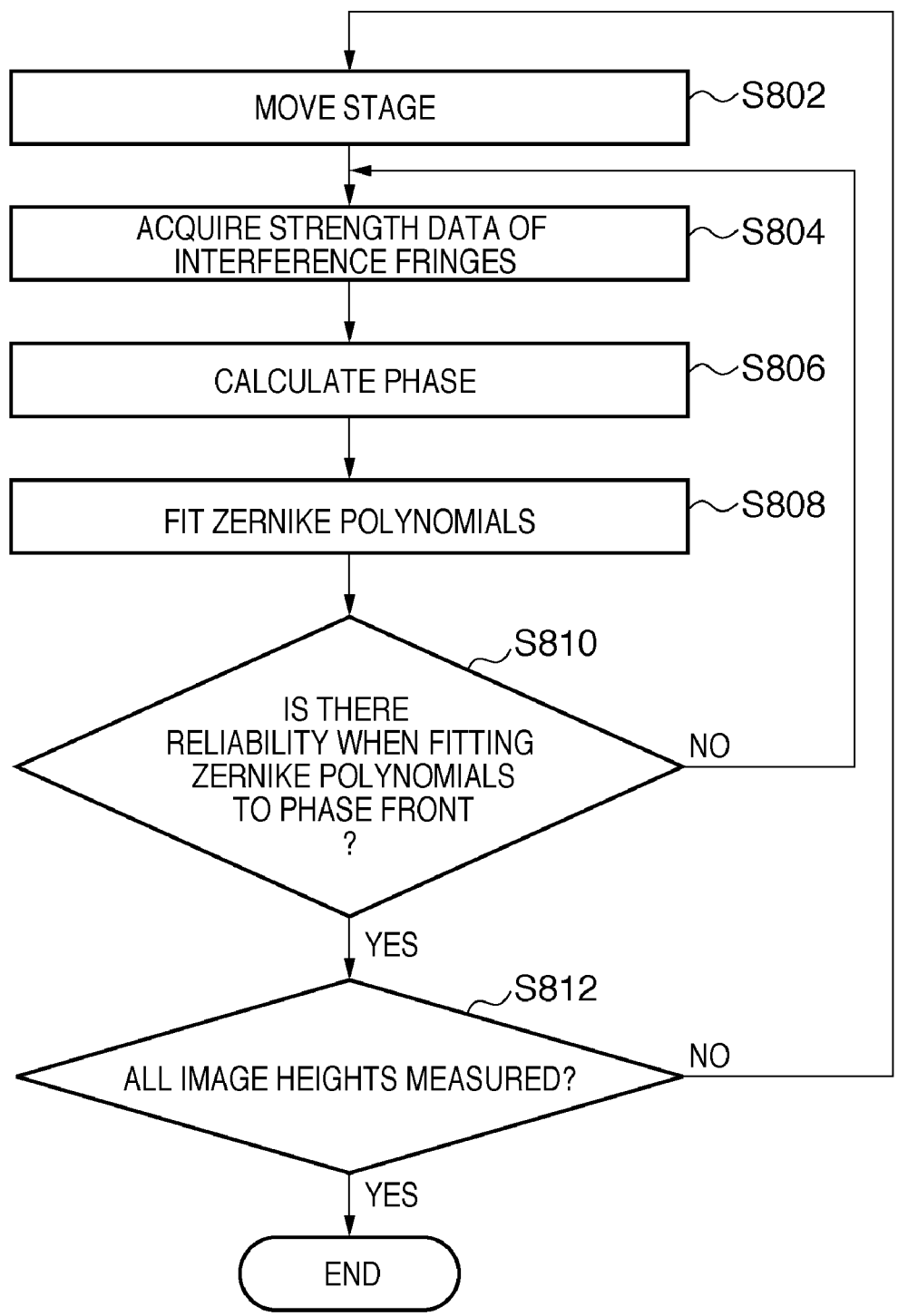
FIG. 8 is a flowchart for explaining a method of measuring the wavefront aberration of the projection optical system.

A method of measuring the wavefront aberration of the projection optical system, including sampling data evaluation of the second embodiment, will be described with reference to FIG. 8. In this embodiment, an example will be explained in which the wavefront aberration of the projection optical system is measured using the interferometer shown in FIG. 3. Note that the processing of measuring the wavefront aberration of the projection optical system is implemented by causing a control unit 37 of the interferometer shown in FIG. 3 to comprehensively control the units of the interferometer.

In step S802, the stage that holds a reflecting mirror 35 is moved so that detection target light that has passed the image height of the measurement target of a projection optical system 34 strikes the reflecting mirror 35. In step S804, an image sensor 36 detects interference fringes between the detection target light that has passed the image height of the measurement target and reference light reflected by the Fizeau surface of a TS lens 33, thereby acquiring the strength data of the interference fringes. In step S806, the phase of the light that has passed the image height of the measurement target is calculated based on the strength data of the interference fringes acquired in step S804. In step S808, Zernike polynomials are fitted to the phase front calculated by the phase calculation in step S806. At this time, first fitting of fitting Zernike polynomials using the first predetermined terms from the first term to the rth term and second fitting of fitting Zernike polynomials using the second predetermined terms from the first term to the sth term are performed. In step S810, in accordance with sampling data evaluation of the second embodiment, the reliability of the phase front when fitting the Zernike polynomials at step S808 to the phase front calculated in step S806 is evaluated. If the reliability of the phase front is guaranteed (that is, the phase front is reliable), the process advances to step S812. On the other hand, if the reliability of the phase front is not guaranteed (that is, the phase front is not reliable), the process returns to step S804 to acquire the strength data of the interference fringes again. In step S812, it is determined whether all the image heights of the measurement target of the projection optical system 34 have been measured. If not all the image heights have been measured, the process returns to step S802 to measure the next image height. If all the image heights have been measured, the measurement of the wavefront aberration of the projection optical system ends.

Third Embodiment

In the third embodiment, evaluation of the reliability (orthogonality) of sampling data when fitting Zernike polynomials to the wavefront aberration of a projection optical system as sampling data will mainly be described, as in the first and second embodiments. In the third embodiment, the reliability of sampling data is evaluated from the change of coefficients when the number of terms of Zernike polynomials to be fitted is changed, as in the second embodiment. Hence, the reliability of sampling data can advantageously be evaluated on the basis of coefficients of Zernike polynomials.

Let $a^r$ be the coefficient of each term when Zernike polynomials using first predetermined terms from the first term to the rth term are fitted to n sampling data $(x_k, w_k)$. Let $a_i$ be the coefficient of the ith term when Zernike polynomials using a second predetermined term including only the ith term are fitted to the n sampling data $(x_k, w_k)$. The second predetermined term is one term included in the first predetermined terms (that is, $i \leq r$). For the ith term of Zernike polynomials, a change $Err_i$ upon changing the number of terms of the Zernike polynomials to be used for fitting is given by $$Err_i = |a_i^r - a_i| \qquad (14)$$

Let $Err_{max}$ be the maximum change of the changes $Err_i$ ($1 < i \leq r$). The reliability of the sampling data is evaluated based on whether the change $Err_{max}$ exceeds a threshold C. In this embodiment, the change $Err_{max}$ is compared with the threshold C. If the change $Err_{max}$ with respect to the threshold C satisfies $$C \geq Err_{max} \qquad (15)$$

the sampling data is evaluated to be reliable (that is, the reliability of the sampling data is guaranteed). Note that the threshold C is determined based on comparison between the missing points of sampling data and the change $Err_{max}$ on the simulation basis.

That is, according to this embodiment, not the number of missing points of sampling data but the change of coefficients when the number of terms of orthogonal functions to be fitted is changed is evaluated, thereby more strictly evaluating the reliability of sampling data.

Note that a method of measuring the wavefront aberration of the projection optical system, including sampling data evaluation of the third embodiment, is the same as the measuring method (FIG. 8) described in the second embodiment, and a detailed description thereof will not be repeated.

Fourth Embodiment

In the fourth embodiment, evaluation of the reliability (orthogonality) of sampling data when fitting Zernike polynomials to the wavefront aberration of a projection optical system as sampling data will mainly be described, as in the first to third embodiments. In the fourth embodiment, a matrix halfway through fitting is manipulated, and the degree of influence of the non-diagonal components of the matrix is compared on the basis of the coefficients of terms of Zernike polynomials.

The first matrix on the left-hand side of equation (9) represents the orthogonal relation of expression (1). Hence, if sampling data contain no missing points, the non-diagonal components of the first matrix on the left-hand side of equation (9) are almost 0. On the other hand, if sampling data contain missing points, the orthogonality is lost due to the missing points, and the non-diagonal components of the first matrix on the left-hand side of equation (9) have values.

Replacing the non-diagonal components of the first matrix on the left-hand side of equation (9) with 0 allows to quantify errors caused by the lost orthogonality. In this embodiment, using a diagonal matrix $diag(G^TG)$ obtained by replacing the non-diagonal components of $G^TG$ with 0, equation (11) is rewritten as $$diag(G^TG)A' = G^TW \qquad (16)$$

Note that A' is defined by $$A' = \begin{pmatrix} a'_1 \\ a'_2 \\ \vdots \\ a'_m \end{pmatrix} \qquad (17)$$

Let $a_i$ be the coefficient of each term of Zernike polynomials obtained from equation (11), and $a_i'$ be the coefficient of each term of Zernike polynomials obtained from equation (16). For the ith term of Zernike polynomials, a change $Err_i$ between the coefficient $a_i$ and the coefficient $a_i'$ is given by $$Err_i = |a_i - a_i'| \qquad (18)$$

Let $Err_{max}$ be the maximum change of the changes $Err_i$ ($1 < i < r$). The reliability of the sampling data is evaluated based on whether the change $Err_{max}$ exceeds a threshold C. In this embodiment, the change $Err_{max}$ is compared with the threshold C. If the change $Err_{max}$ with respect to the threshold C satisfies $$C \geq Err_{max} \qquad (19)$$

the sampling data is evaluated to be reliable (that is, the reliability of the sampling data is guaranteed). Note that the threshold C is determined based on comparison between the missing points of sampling data and the change $Err_{max}$ on the simulation basis.

That is, according to this embodiment, not the number of missing points of sampling data but the matrix halfway through fitting is manipulated, thereby more strictly evaluating the reliability of sampling data.

Fifth Embodiment

In the fifth embodiment, an exposure apparatus including a Fizeau interferometer for measuring the wavefront aberration of a projection optical system will be described. Note that when the light source of the exposure apparatus is an excimer laser, the coherence length is about several ten mm. However, since the total length of the projection optical system as the measurement target is about 1,000 mm, no Fizeau interferometer can be formed in general. Hence, the exposure apparatus of this embodiment has a measurement light source different from the exposure light source as the light source of the interferometer to be used to measure the wavefront aberration of the projection optical system.

Figure 9:
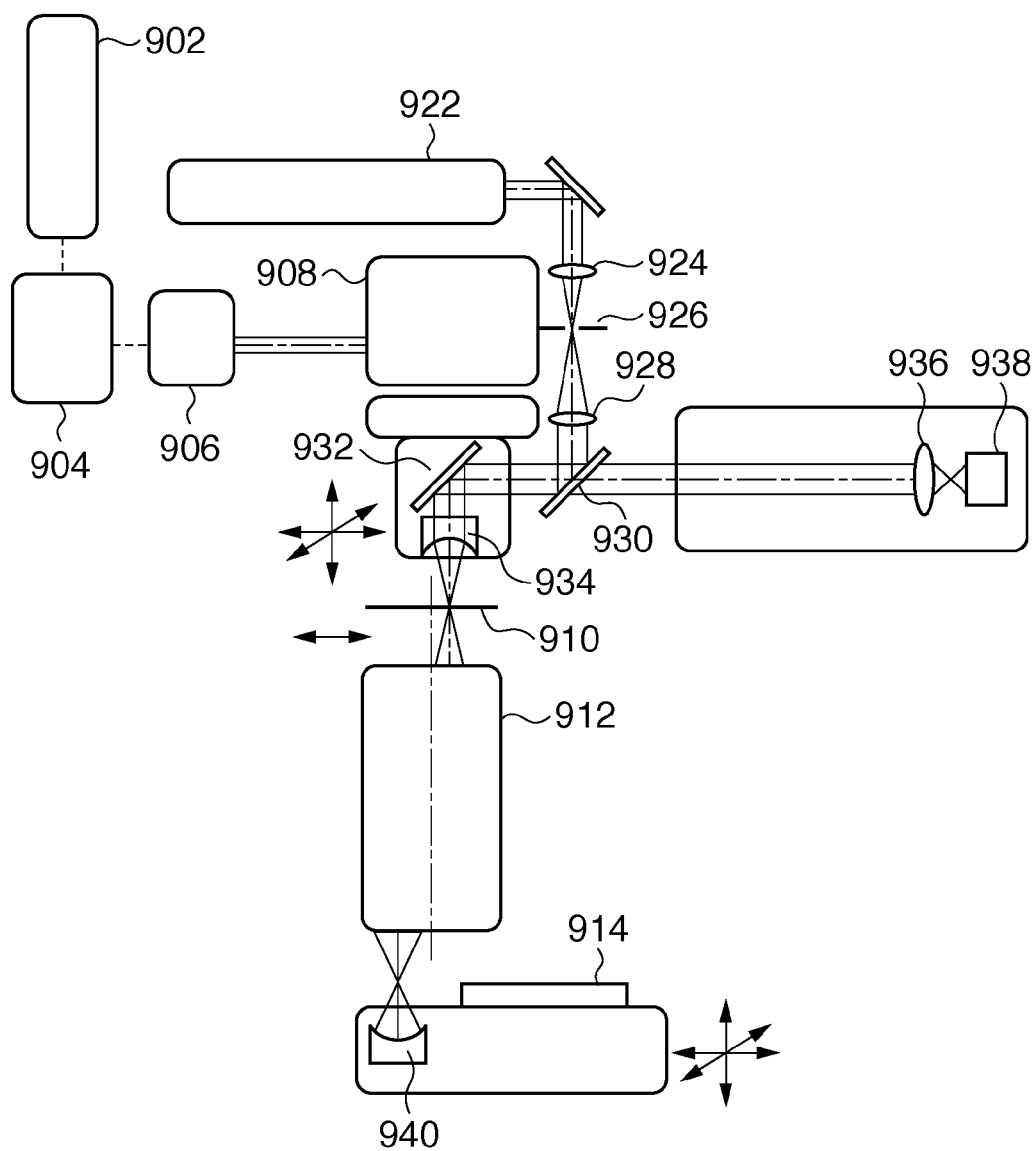
FIG. 9 is a schematic view showing an example of the arrangement of an exposure apparatus.

Referring to FIG. 9, an exposure light source 902 such as an ArF excimer laser with a wavelength of about 193 nm emits light. The light is shaped into a beam symmetrical with respect to the optical axis by a beam shaping optical system 904 and input to an incoherent unit 906. The light whose coherence length is reduced by the incoherent unit 906 illuminates, via an illumination optical system 908, a reticle 910 having a pattern. An image of the pattern of the reticle 910 is formed on a wafer 914 through a projection optical system 912.

In the interferometer included in the exposure apparatus, light emitted by a measurement light source 922 enters, via a condensing system 924 and a pinhole 926, a collimator lens 928 for forming a parallel beam. Since the diameter of the pinhole 926 is set to be the same as that of an Airy's disk determined by the numerical aperture of the collimator lens 928, the light that has passed through the pinhole 926 is an almost ideal spherical wave. Since the collimator lens 928 is an almost stigmatic optical system, the light that has exited from it is an ideal plane wave. The light that has exited from the collimator lens 928 enters an objective lens 934 via a half mirror 930 and a mirror 932. The mirror 932 and the objective lens 934 are held by, for example, an XYZ stage (not shown) that holds the reticle 910.

Generally, the exposure apparatus includes a TTR alignment scope which detects the position of the wafer 914 via the reticle 910 so as to align the reticle 910 and the wafer 914. Note that the TTR alignment scope is held by a driving mechanism for driving the TTR alignment scope to an arbitrary position above the reticle 910. In this embodiment, the TTR alignment scope also serves as the objective lens 934. This allows the objective lens 934 to retreat from the optical path of the projection optical system 912 upon performing exposure and come onto the optical path of the projection optical system 912 when measuring the wavefront aberration of the projection optical system 912. In addition, using the driving mechanism of the TTR alignment scope enables to measure a plurality of points in the screen of the exposure region.

The radius of curvature of the final surface (reference surface) of the objective lens 934 on the side of the projection optical system 912 is set to the same as the distance up to the pattern surface of the reticle 910. The light reflected by the final surface of the objective lens 934 enters an image sensor 938 as reference light via the mirror 932, half mirror 930, and condensing system 936.

On the other hand, the light transmitted through the objective lens 934 enters, via the projection optical system 912, a spherical mirror 940 arranged on a wafer stage that holds the wafer 914. The radius of curvature of the spherical mirror 940 is set to the same as the distance up to the imaging position of the projection optical system 912. The light reflected by the spherical mirror 940 enters the image sensor 938 as detection target light via the projection optical system 912, objective lens 934, mirror 932, half mirror 930, and condensing system 936.

The image sensor 938 detects interference fringes (interference pattern) formed by the detection target light and the reference light. Based on the (strength data of the) interference fringes, phase calculation and fitting using Zernike polynomials are performed to calculate the wavefront aberration of the projection optical system.

In exposure, the light emitted by the exposure light source 902 illuminates the reticle 910 via the beam shaping optical system 904, incoherent unit 906, and illumination optical system 908. The light that reflects the pattern of the reticle 910 forms an image on the wafer 914 via the projection optical system 912. The projection optical system 912 is adjusted based on the wavefront aberration measured by the Fizeau interferometer included in the exposure apparatus. Note that the interferometer obtains the wavefront aberration of the projection optical system from sampling data whose reliability is guaranteed by one of the sampling data reliability evaluation methods according to the above-described first to fourth embodiments. Hence, in the exposure apparatus, the wavefront aberration of the projection optical system is accurately measured, and the projection optical system is accurately adjusted based on the wavefront aberration. As a result, the exposure apparatus can economically provide a high-quality device (for example, a semiconductor integrated circuit device or liquid crystal display device) at a high throughput. Note that the device is manufactured by the step of causing the exposure apparatus to expose a substrate (for example, wafer or glass plate) to which a photoresist is applied, the step of developing the exposed substrate, and other known steps.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

Note that in the above embodiments, the wavefront aberration of a projection optical system is used as sampling data, and Zernike polynomials are used as orthogonal functions to be fitted to the sampling data. However, the present invention is applicable to any case in which orthogonal functions are fitted to sampling data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2009-177028 filed on Jul. 29, 2009, which is hereby incorporated by reference herein in its entirety.

What is claimed is:

1. A measuring apparatus which executes measurement of a wavefront aberration of an optical system and represents the wavefront aberration by linear combination of orthogonal functions, the apparatus comprising:
   a detector configured to detect, with respect to each pixel thereof, an interference pattern including information of the wavefront aberration; and
   a processor configured to obtain the wavefront aberration based on the interference pattern detected by the detector,
   wherein the processor is configured, if the interference pattern detected by the detector includes an invalid pixel with respect to which the measurement is invalid, to obtain a degree of break of orthogonality of an orthogonal function system caused by the invalid pixel, and to evaluate reliability of the measurement based on the obtained degree of break.

2. An apparatus according to claim 1, wherein the processor is configured to obtain, as the degree, a degree of orthogonality of a function system where values of the orthogonal functions at the invalid pixel are changed to zero.

3. An apparatus according to claim 1, wherein the processor is configured to obtain, as the degree, a degree of change of coefficients for the same orthogonal function where number of orthogonal functions representing the wavefront aberration is changed.

4. An apparatus according to claim 1, wherein the processor is configured to obtain, as the degree, a degree of change of coefficients for the same function where orthogonality is improved for a function system obtained by changing values of the orthogonal functions at the invalid pixel to zero.

5. An apparatus according to claim 1, wherein the processor is configured to obtain, as the wavefront aberration, the linear combination if the evaluated reliability falls within an allowable range.

6. An apparatus according to claim 1, wherein the processor is configured to cause the detector to detect the interference pattern again if the evaluated reliability falls outside an allowable range.

7. A method of manufacturing an optical system, the method comprising:
    measuring a wavefront aberration of the optical system using a measuring apparatus defined in claim 1; and
    adjusting the optical system based on the measured wavefront aberration.

8. An exposure apparatus which projects a light from an illuminated original onto a substrate and exposes the substrate to the projected light, the apparatus comprising:
    a projection optical system configured to project the light onto the substrate; and
    a measuring apparatus defined in claim 1 configured to measure a wavefront aberration of the projection optical system,
    wherein the apparatus is configured to adjust the projection optical system based on the measured wavefront aberration.

9. A method of manufacturing a device, the method comprising:
    exposing a substrate to a light using an exposure apparatus defined in claim 8;
    developing the exposed substrate; and
    processing the developed substrate to manufacture the device.

10. A processing apparatus which executes sampling of data and represents the sampled data by linear combination of orthogonal functions, the apparatus comprising:
    a detector configured to execute, with respect to each pixel thereof, the sampling of data; and
    a processor configured to process the data sampled by the detector,
    wherein the processor is configured, if the data sampled by the detector includes an invalid pixel with respect to which the sampling is invalid, to obtain a degree of break of orthogonality of an orthogonal function system caused by the invalid pixel, and to evaluate reliability of the sampling based on the obtained degree of break.

* * * * *